United States Patent
Jang

(10) Patent No.: US 6,725,026 B2
(45) Date of Patent: Apr. 20, 2004

(54) INTERMODULATION CONTROL DEVICE AND METHOD IN MOBILE COMMUNICATION SYSTEM

(75) Inventor: Young-Geun Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 528 days.

(21) Appl. No.: 09/751,224

(22) Filed: Dec. 29, 2000

(65) Prior Publication Data

US 2001/0021644 A1 Sep. 13, 2001

(30) Foreign Application Priority Data

Dec. 29, 1999 (KR) .......................................... 1999-64546

(51) Int. Cl.$^7$ ................................................ H04B 1/10
(52) U.S. Cl. .................... 455/295; 455/63.1; 455/67.13; 455/287; 455/296
(58) Field of Search ............................ 455/63.1, 67.11, 455/67.13, 131, 232.1, 234.1, 295, 296, 572, 574, 334, 341, 343.1, 343.2, 283.287, 226.1, 226.2, 226.3

(56) References Cited

U.S. PATENT DOCUMENTS

| | | | | |
|---|---|---|---|---|
| 5,230,096 A | * | 7/1993 | Davies et al. ................ | 455/287 |
| 5,513,386 A | * | 4/1996 | Ogino et al. ................ | 455/296 |
| 5,797,090 A | * | 8/1998 | Nakamura ............... | 455/234.1 |
| 6,397,090 B1 | * | 5/2002 | Cho .......................... | 455/572 |

* cited by examiner

*Primary Examiner*—Quochien B. Vuong
(74) *Attorney, Agent, or Firm*—Dilworth & Barrese LLP

(57) ABSTRACT

There is provided an intermodulation (IMD) control device and method in a mobile communication system. In the IMD control device, an LNA performs low noise amplification on an input RF signal, a first switch is connected to the LNA in parallel, for switching according to a first control signal received for IMD control, a frequency converter down-converts the output of the LNA to an IF signal, an IF amplifier amplifies the IF signal, a second switch is connected in parallel to the IF amplifier, for switching according to a second IMD control signal received for IMD control, and a controller generates the IMD control signals at voltage levels determined according to an RSSI and an energy to noise ratio.

5 Claims, 6 Drawing Sheets

INTERMODULATION CONTROL DEVICE AND METHOD IN MOBILE COMMUNICATION SYSTEM

This application claims priority to an application entitled "Intermodulation Control Device and Method in Mobile Communication System" filed in the Korean Industrial Property Office on Dec. 29, 1999 and assigned Serial No. 99-64546, the contents of which are hereby incorporated by reference.

BACKGROUND OF THE INVENTION

1. Field of the Invention

The present invention relates generally to an IMD (Intermodulation) control device and method in a mobile communication system, and in particular, to an IMD control device and method using a switch.

2. Description of the Related Art

Single tone desensitization and intermodulation spurious response attenuation are significant factors in designing a mobile station in the RF (Radio Frequency) field. In many cases, these two factors cause current consumption in designing a receiver and increase the cost of terminal parts. Therefore, research has been made on methods of increasing the performance of a mobile station with low current consumption, to satisfy minimum performance standards related to these factors.

Regarding the intermodulation spurious response attenuation that falls into the field related to the present invention, its minimum performance standards (e.g., IS-98A Receiver Performance Intermodulation Spurious Response Attenuation Test shown in Table 1) are specified in three items in the table. The three items differ in frequency band. For example, only one item applies to the PCS (Personal Communication Services) frequency band and the three items apply to the CDMA (Code Division Multiple Access) frequency band, 900 MHz due to the dual mode of CDMA and AMPS (Advanced Mobile Phone System). For PCS, a circuit used for single tone desensitization also satisfies the intermodulation item. However, two of the three items must be additionally controlled for CDMA. The second item of −32 dBm can be satisfied by controlling current flowing through an IF (Intermediate Frequency) amplifier, whereas it is impossible to satisfy the third item of −21 dBM through current control alone. To satisfy the third item, it is necessary to eliminate a high level harmonic component by reducing the power level of a received signal (a dual-tone signal in the test), thus reducing the influence of the harmonic component.

FIGS. 1, 2, and 3 are block diagrams of conventional IMD control devices to eliminate a high level harmonic component. The conventional IMD control device shown in FIG. 1 has a diode 124 connected between a duplexer 104 and an LNA (Low Noise Amplifier) 106 above a ground terminal to reduce the power level of an input signal. Another conventional IMD control device shown in FIG. 2 has a diode 126 connected between a SAW (Surface Acoustic Wave Filter) 108 and a mixer 116 above the ground terminal to reduce the power level of an input signal. A third conventional IMD control device shown in FIG. 3 has a switch 128 connected to the LNA 106 in parallel to reduce the power level of an input signal. The three conventional IMD control devices aim at minimization of harmonic influence caused by intermodulation between the LNA 106 and the IF amplifier 118 by reducing the power levels of input signals.

The above conventional IMD control devices perform IMD control only at an RF end, that is, at an LNA. The IMD control of the LNA causes great current consumption (e.g., 10 mA) at an IF amplifier and makes it impossible to optimize the performance of a mobile station.

SUMMARY OF THE INVENTION

It is, therefore, an object of the present invention to provide an IMD control device and method in a mobile communication system to overcome the problems of conventional control devices.

It is another object of the present invention to provide a device and method for reducing current consumption during an IMD control operation in order to minimize the influence of IMD in a mobile station.

It is a further object of the present invention to provide an IMD control device and method for optimizing the performance of a mobile station.

To achieve the above and other objects, in an IMD control device for a mobile communication system, an LNA performs low noise amplification on an input RF signal, a first switch is connected to the LNA in parallel, for switching according to a first control signal received for IMD control, a frequency converter down-converts the output of the LNA to an IF signal, an IF amplifier amplifies the IF signal, a second switch is connected in parallel to the IF amplifier, for switching according to a second IMD control signal received for IMD control, and a controller generates the IMD control signals at voltage levels determined according to an RSSI and an energy to noise ratio.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described hereinbelow with reference to the accompanying drawings. In the following description, well-known functions or constructions are not described in detail since they would obscure the invention in unnecessary detail.

Figure 1:
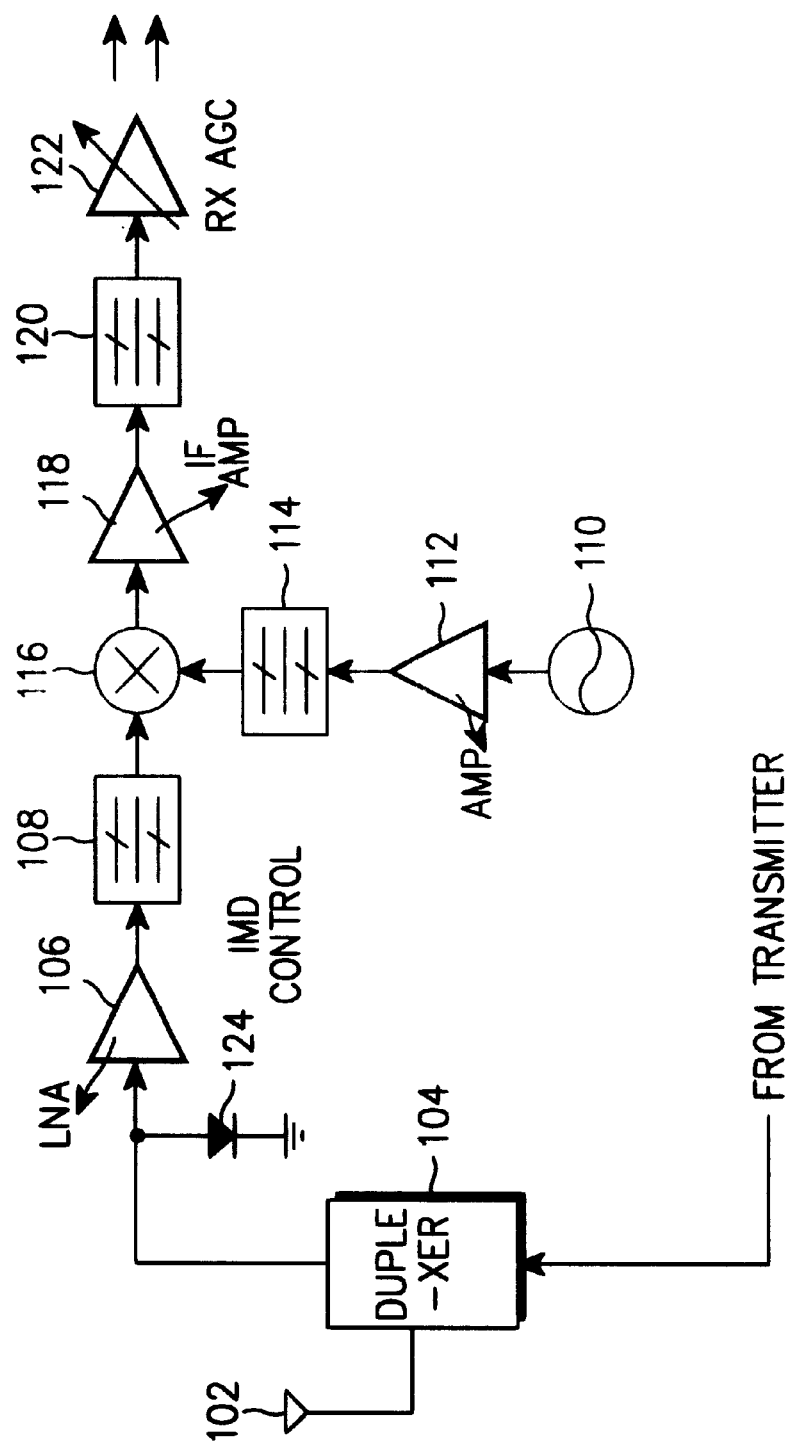
FIG. 1 is a block diagram of a conventional IMD control device.
Figure 2:
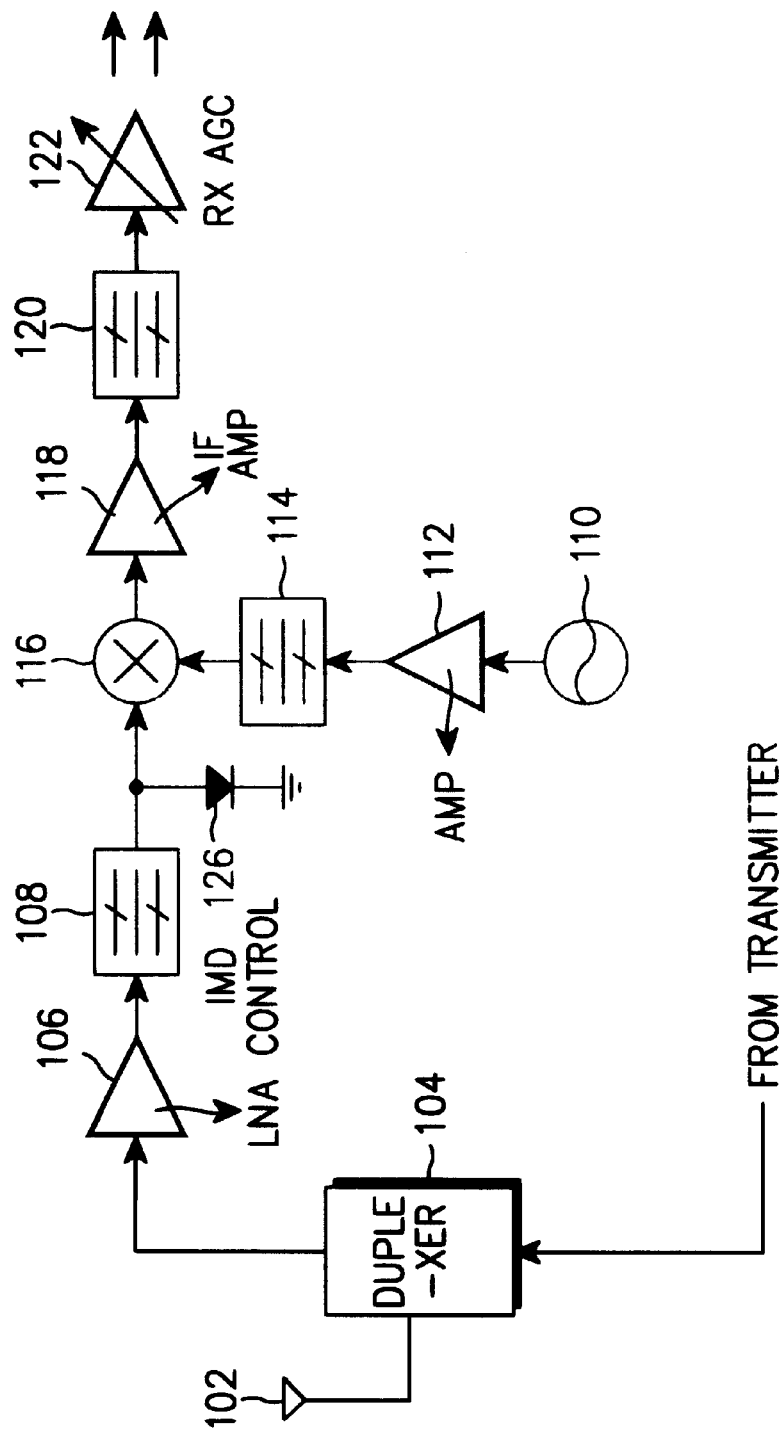
FIG. 2 is a block diagram of another conventional IMD control device.
Figure 3:
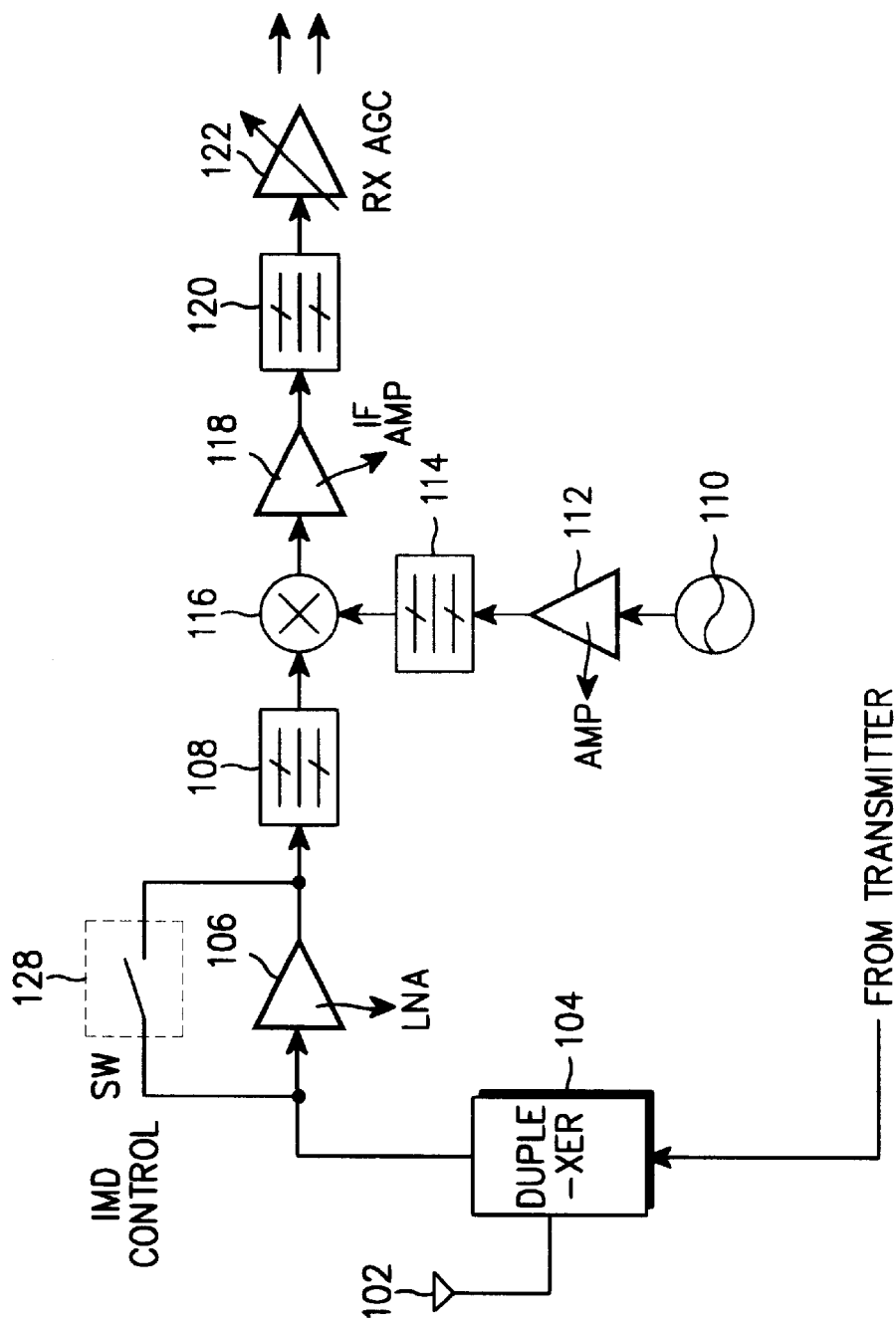
FIG. 3 is a block diagram of a third conventional IMD control device.
Figure 4:
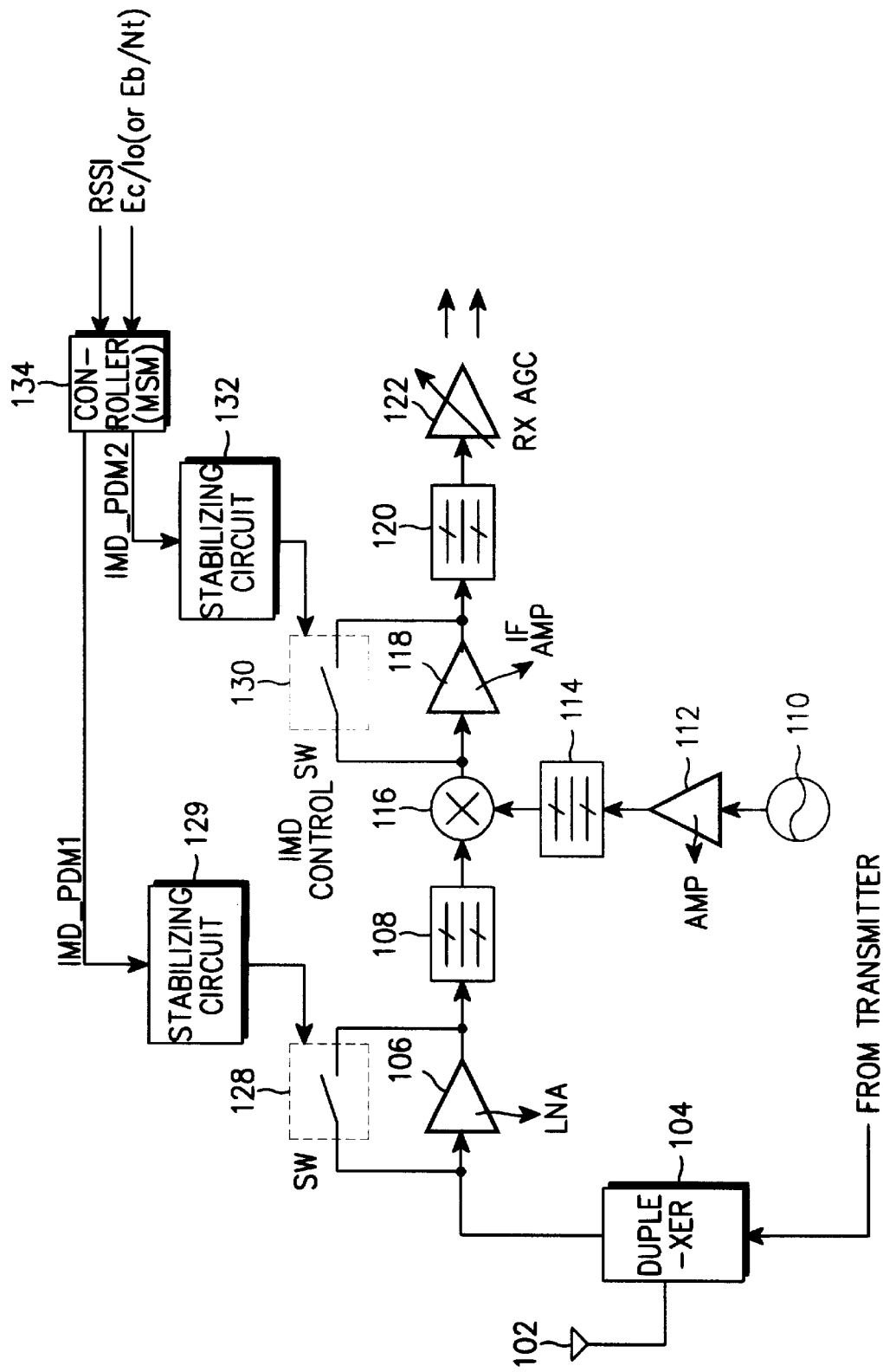
FIG. 4 is a block diagram of an IMD control device according to the present invention.

FIG. 4 is a block diagram of an IMD control device according to an embodiment of the present invention. This IMD control device performs IMD control at an IF amplifier 118 for amplifying an IF signal as well as at an LNA 128 for amplifying an RF signal in a mobile station having the LNA 128, a mixer 116 for down-converting the amplified RF signal to the IF signal, and the IF amplifier 118.

Referring to FIG. 4, the IMD control device includes a switch (SW) 128 connected to the LNA 106 in parallel and a switch (SW) 130 connected to an IF amplifier (IF AMP)

118 in parallel. The switching operations of the switches 128 and 130 are controlled by an IMD_PDM1 signal and an IMD_PDM2 signal received from a controller (so-called MSM chip: Mobile Station Modem chip) 134, for IMD control. The switch 128 may be incorporated with the LNA 106 and the switch 130 may be incorporated with the IF amplifier 118. In other words, an LNA with a switching function and an IF amplifier with a switching function may substitute for the LNA 106 and the IF amplifier 118, respectively. A stabilizing circuit 129 is connected between the controller 134 and the switch 128 and a stabilizing circuit 132 is connected between the controller 134 and the switch 130. The stabilizing circuits 129 and 132 can be constituted as shown in FIGS. 5 and 6.

Figure 5:
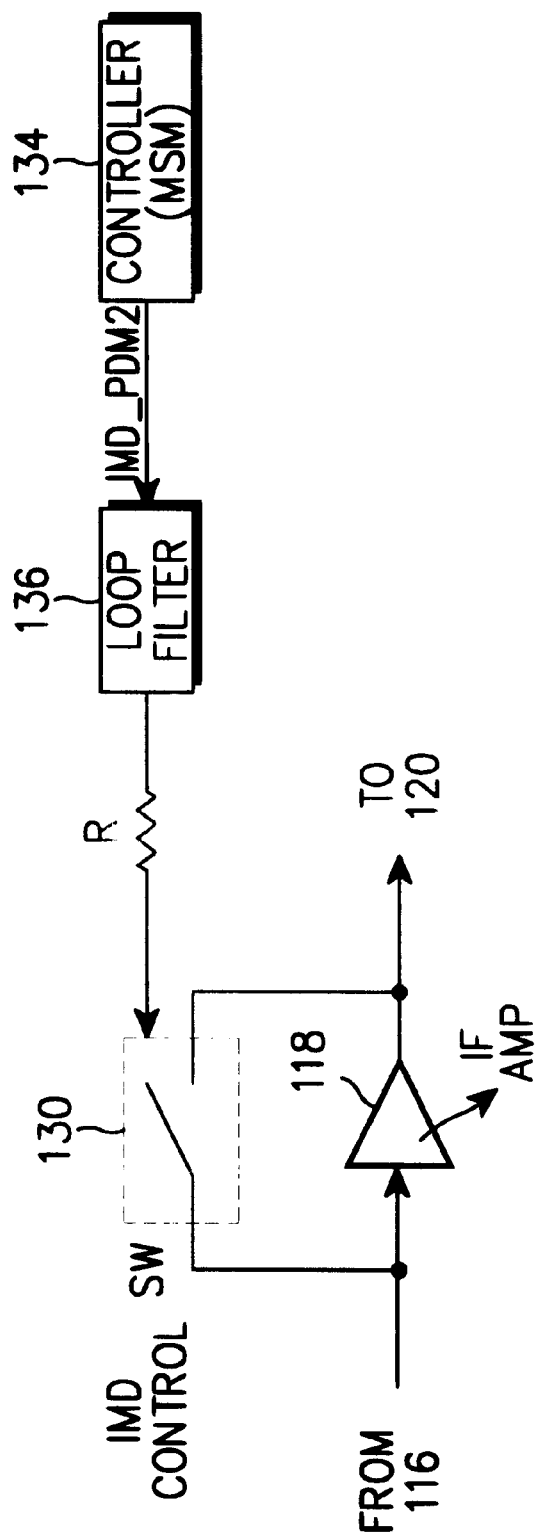
FIG. 5 is a detailed block diagram of an embodiment of a stabilizing circuit shown in FIG. 4.

FIG. 5 is a detailed block diagram of an embodiment of the stabilizing circuit 132 shown in FIG. 4. The stabilizing circuit 129 shown in FIG. 4 can be configured in the same manner as the stabilizing circuit 132.

Referring to FIG. 5, the stabilizing circuit 132 includes a loop filter 136 and a resistor R which are serially connected. The controller 134 feeds the IMD_PDM (Pulse Density Modulation) signal to the switch 130 via the loop filter 136 and the resistor R, for control of switching. In this figure, the stabilizing circuit 132 is shown to be constituted of passive devices.

Figure 6:
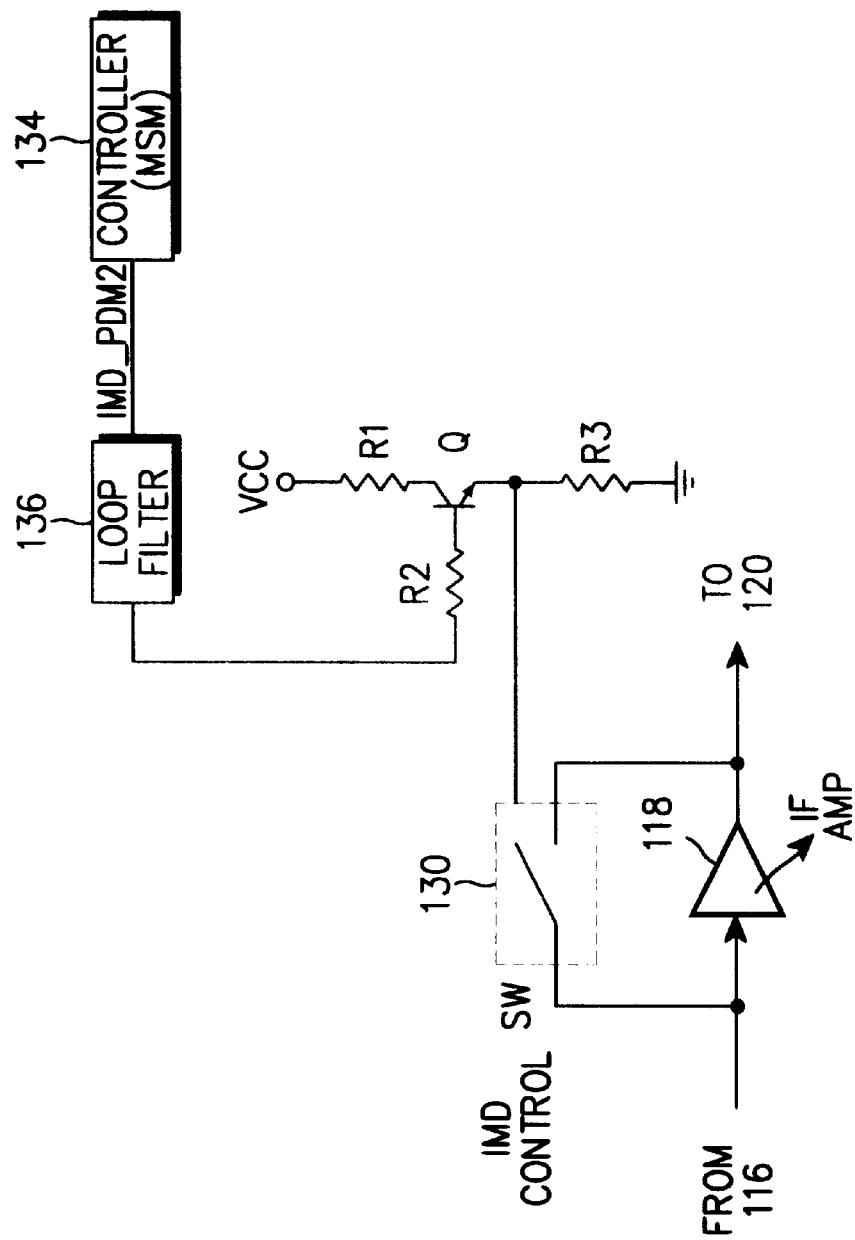
FIG. 6 is a detailed block diagram of another embodiment of the stabilizing circuit shown in FIG. 4.

FIG. 6 is a detailed block diagram of another embodiment of the stabilizing circuit 132 shown in FIG. 4.

Referring to FIG. 6, the stabilizing circuit 132 includes the loop filter 136, resistors R1, R2, and R3, and a transistor Q. The transistor Q is an NPN transistor having a collector, a base, and an emitter. The loop filter 136 has an input port connected to the controller 134, for receiving the IMD_PDM signal, and an output port connected to an end of the resistor R2. The other end of the resistor R2 is connected to the base of the transistor Q. The resistor R1 has an end connected to the collector of the transistor Q. A power voltage VCC is applied to the other end of the resistor R1. The emitter of the transistor Q is connected to a ground terminal through resistor R3 and to the switch 130 for control of switching.

Referring back to FIG. 4, the switch 128 is connected to the LNA 106 in parallel and the switch 130 is connected to the IF amplifier 118 in parallel for IMD control. The IMD_PDM1 signal and the IMD_PDM2 signal for controlling the switches 128 and 130, respectively are provided from the controller 134. For example, the controller 134 may be an MSM2300 chip manufactured by Qualcomm. In this case, the controller 134 is provided with RF control pins PDM1 and PDM2 (not shown). These control pins can be used as ones for outputting the IMD_PDM1 and IMD_PDM2 signals. For example, the controller 134 can output the IMD_PDM1 signal via the control pin PDM1 and the IMD_PDM2 signal via the control pin PDM2. The controller 134 reads an RSSI (Received Signal Strength Indicator) and an energy-to-noise ratio (Eb/Nt) and generates the IMD_PDM 1 and IMD_PDM2 signals at voltage levels corresponding to the present IMD situation. The RSSI and the energy-to-noise ratio can be measured in an RSSI measurer (not shown) and an energy-to-noise ratio measurer (not shown) as well known. The IMD_PDM1 signal has a voltage level that determines whether the switch 128 is turned on or off and the IMD_PDM2 signal has a voltage level that determines whether the switch 130 is turned on or off. If the stabilizing circuit 132 is constituted as shown in FIG. 5, the voltage level of the IMD PDM signal can be determined considering the difference between the voltage levels of input and output signals of the loop filter 136 and a voltage decrement by the resistor R. On the other hand, if the stabilizing circuit 32 is constituted as shown in FIG. 6, the voltage level of the IMD_PDM can be determined considering the difference between the voltage levels of the input and output signals of the loop filter 136 and the difference between the voltage levels of signals at the emitter and at the base of the transistor Q upon application of a signal to the base. The voltage level difference between the base and the emitter of the transistor Q is controllable according to the values of the resistors R1, R2, and R3.

In the IMD control device according to the embodiment of the present invention, the LAN 106 is connected to the switch 128 in parallel, the IF amplifier 118 is connected to the switch 130 and the controller 134 senses the IMD situation and feeds the IMD_PDM1 and IMS_PDM2 signals to the switch 130 Particularly, use of amplifiers with a switching function as the LNA 106 and the IF amplifier 118 will facilitate designing of the IMD control device. That is, the IMD problem is readily solved by applying the IMD_PDM1 and IMD_PDM2 signals at voltage levels suitable for switching the switches 128 and 130. Furthermore, only if impedance at both sides of the switches 128 and 130 are matched, ripples can be eliminated because an input signal passes through the switches 128 and 130.

Prior to describing the operation of the IMD control device shown in FIGS. 4, 5, and 6, Table 1 below lists items related to CDMA and PCS in the intermodulation spurious response attenuation test.

TABLE 1

IS98-A Receiver Performance Intermodulation Spurious Response Attenuation Test

| Parameter | Ior (dBm/1.23 MHz) | Mobile Station Class II, III | |
|---|---|---|---|
| | | Test 1 | Test 2 |
| Tone 1 offset from carrier | | +900 KHz | −900 KHz |
| Tone power 1 | −101 (1) | −43 dBm | −43 dBm |
| | −90 (2) | −32 dBm | −32 dBm |
| | −79 (3) | −21 dBm | −21 dBm |
| Tone 2 offset from carrier | | +1700 KHz | −1700 KHz |
| Tone power 2 | −101 (1) | −43 dBm | −43 dBm |
| | −90 (2) | −32 dBm | −32 dBm |
| | −79 (3) | −21 dBm | −21 dBm |
| Pilot Ec/Ior | | −7 dBm | −7 dBm |
| Traffic Ec/Ior | | −15.6 dBm | −15.6 dBm |

In Table 1, the three items (1), (2), and (3) are all related to CDMA, and only the first of them is related to PCS. Here, a tone 1 offset from a carrier is 900 KHs, a tone 2 offset from the carrier is 1700 KHz, and Ior is the power of a signal received from a base station to which the mobile station belongs to. In test 1, a +900-KHz tone 1 and a +1700-KHz tone 2 are generated and these tones and a signal from the base station are received at an antenna of the mobile station via a so-called jammer. In test 2. A −900-KHz tone and a −1700-KHz tone 2 are generated and theses tones and the signal from the base station are received at the antenna of the mobile station via the jammer. Here, the power of the signal from the base station varies with the items.

The operation of the novel IMD control device according to the present invention will be described below.

The LNA 106 shown in FIG. 4 is designed to satisfy single tone desensitization. If the single tone desensitization is satisfied, the first item (−43 dBm) is also satisfied. Thus, the second and third items are notable considerations. As described above, RF interface control pins for an MSM2300 chip made by Qualcomm that can be used as the controller 134 are PDM1 and PDM2. A user can selectively use these control pins, for IMD control. Therefore, about 260 PDM signals can be generated depending on the RSSI and Eb/No of a mobile station. That is, a desired voltage can be applied to the switch 130 by empirically setting the voltage of the IDM_PDM signal so that the switch 130 may output a signal at an intended level.

If a jamming signal is applied to an antenna 102 shown in FIG. 4, it means that signals stronger than an intended signal of the mobile station are received. In view of the design of the LNA 106 for satisfying single tone desensitization, it is not reasonable to expect a further performance increase from the LNA 106. In reality, dual tone-caused intermodulation occurs in the IF amplifier 118. A dual tone signal is amplified in the same manner as the intended signal of the mobile station across the RF SAW filter 108 to the mixer 116 and a higher level signal than an input signal of the LNA 106 is applied to the input of the IF amplifier 118. As a result, the IF amplifier 118 having a lower ICP1 (Input Compression Point 1 dB) than that of the LNA 106 is highly susceptible to the influence of dual tone-caused intermodulation spurious response. Therefore, if the controller 134 generates the IMD_PDM signals at intended voltage levels and switches on the switch 130 upon receipt of the jamming signal via the antenna 102, a signal received at the IF amplifier 118 via the LNA 106, the SAW filter 108, and the mixer 116 does not experience intermodulation and most signals are removed as they pass through an IF filter 120. Consequently, the influence of the dual tone is minimized.

As described above, the IMD control device of the present invention controls IMD at an IF amplifier as well as at an LNA. As compared to the case that an IMD control is performed only at the LNA, current consumption at the IF amplifier can be decreased. Furthermore, IMD control at both sides of a receiver makes the performance of a mobile station optimal.

While the invention has been shown and described with reference to a certain preferred embodiment thereof, it will be understood by those skilled in the art that various changes in form and detail may be made therein without departing from the spirit and scope of the invention as defined by the appended claims.

What is claimed is:

1. An intermodulation (IMD) control device in a mobile communication system, comprising:

a low noise amplifier (LNA) for performing low noise amplification on an input RF (Radio Frequency) signal;

a first switch connected to the LNA in parallel, for switching according to a first control signal received for IMD control;

a frequency converter for down-converting the output of the LNA to an IF (Intermediate Frequency) signal;

an IF amplifier for amplifying the IF signal;

a second switch connected in parallel to the IF amplifier, for switching according to a second IMD control signal received for IMD control;

a controller for generating the IMD control signals at voltage levels determined according to a received signal strength indicator (RSSI) and an energy to noise ratio;

a first stabilizing circuit connected between the controller and the first switch for stabilizing the first IMD control signal; and a second stabilizing circuit connected between the controller and the second switch for stabilizing the second IMD control signal.

2. The IMD control device of claim 1, wherein the switches are incorporated with the amplifiers.

3. The IMD control device of claim 1, wherein each of the first and second stabilizing circuits includes a loop filter and a resistor that are serially connected between the controller and the switch.

4. The IMD control device of claim 1, wherein each of the first and second stabilizing circuits includes a loop filter and a transistor that are serially connected between the controller and the switch.

5. An IMD control method in a mobile communication system having an LNA for performing low noise amplification on an input RF signal, a frequency converter for down-converting the output of the LNA to an IF signal, and an IF amplifier for amplifying the IF signal, the method comprising the steps of:

generating a first IMD control signal and a second IMD control signal at voltage levels determined according to an RSSI and an energy to noise ratio;

stabilizing the first IMD control signal and the second IMD control signal;

selectively amplifying the RF signal according to the first stabilized IMD control signal at the LNA; and selectively amplifying the IF signal according to the second stabilized IMD control signal at the IF amplifier.

* * * * *